United States Patent
Boeck et al.

(10) Patent No.: US 7,989,919 B2
(45) Date of Patent: Aug. 2, 2011

(54) CAPACITOR ARRANGEMENT AND METHOD FOR MAKING SAME

(75) Inventors: Josef Boeck, Munich (DE); Karl-Heinz Allers, Haar (DE); Klaus Goller, Regensburg (DE); Rudolf Lachner, Ingolstadt (DE); Wolfgang Liebl, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/477,857

(22) Filed: Jun. 3, 2009

(65) Prior Publication Data

US 2010/0309606 A1  Dec. 9, 2010

(51) Int. Cl.
  *H01L 20/02* (2006.01)
(52) U.S. Cl. .. 257/535; 257/528; 257/532; 257/E27.048
(58) Field of Classification Search .................. 257/296, 257/298, 528, 532, 535, E27.016, E27.048, 257/E27.087, E27.088, E27.342, E27.343
  See application file for complete search history.

(56) References Cited

U.S. PATENT DOCUMENTS

| | | | |
|---|---|---|---|
| 6,198,617 B1 | 3/2001 | Sun | |
| 6,451,664 B1 | 9/2002 | Barth et al. | |
| 7,285,490 B2 | 10/2007 | Barth et al. | |
| 7,440,334 B2 | 10/2008 | Barth et al. | |
| 2004/0152258 A1* | 8/2004 | Kiyotoshi | 438/253 |
| 2004/0248400 A1 | 12/2004 | Kim et al. | |
| 2004/0256654 A1 | 12/2004 | Korner et al. | |
| 2005/0012223 A1 | 1/2005 | Koller et al. | |
| 2005/0093094 A1 | 5/2005 | Diorio et al. | |
| 2005/0118778 A1* | 6/2005 | Gau | 438/396 |
| 2005/0121744 A1* | 6/2005 | Chang et al. | 257/532 |
| 2005/0224908 A1 | 10/2005 | Barth | |
| 2005/0236690 A1 | 10/2005 | Chung | |
| 2005/0287755 A1 | 12/2005 | Bachmann et al. | |
| 2006/0214265 A1 | 9/2006 | Goebel et al. | |
| 2007/0034959 A1 | 2/2007 | Esmark et al. | |

FOREIGN PATENT DOCUMENTS

DE  102005056906 A1  5/2007

* cited by examiner

*Primary Examiner* — Evan Pert
*Assistant Examiner* — Eduardo A Rodela
(74) *Attorney, Agent, or Firm* — Infineon Technologies AG; Philip H. Schlazer

(57) ABSTRACT

One or more embodiments relate to a semiconductor chip including a capacitor arrangement, the capacitor arrangement comprising: a first capacitor; and a second capacitor stacked above the first capacitor, the first capacitor and the second capacitor coupled in series between a first metallization level and a second metallization level adjacent the first metallization level.

13 Claims, 12 Drawing Sheets

CAPACITOR ARRANGEMENT AND METHOD FOR MAKING SAME

FIELD OF THE INVENTION

Generally, the present invention relates to semiconductor structures, and, in particular, to semiconductor structures including capacitors.

BACKGROUND OF THE INVENTION

Capacitors may be a part of semiconductor structures. For example, capacitors may be part of semiconductor chips, integrated circuits or semiconductor devices. Examples of capacitors include, but not limited to, stacked capacitors, metal-insulator-metal (MIM) capacitors, trench capacitors and vertical-parallel-plate (VPP) capacitors. New capacitor structures are needed.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
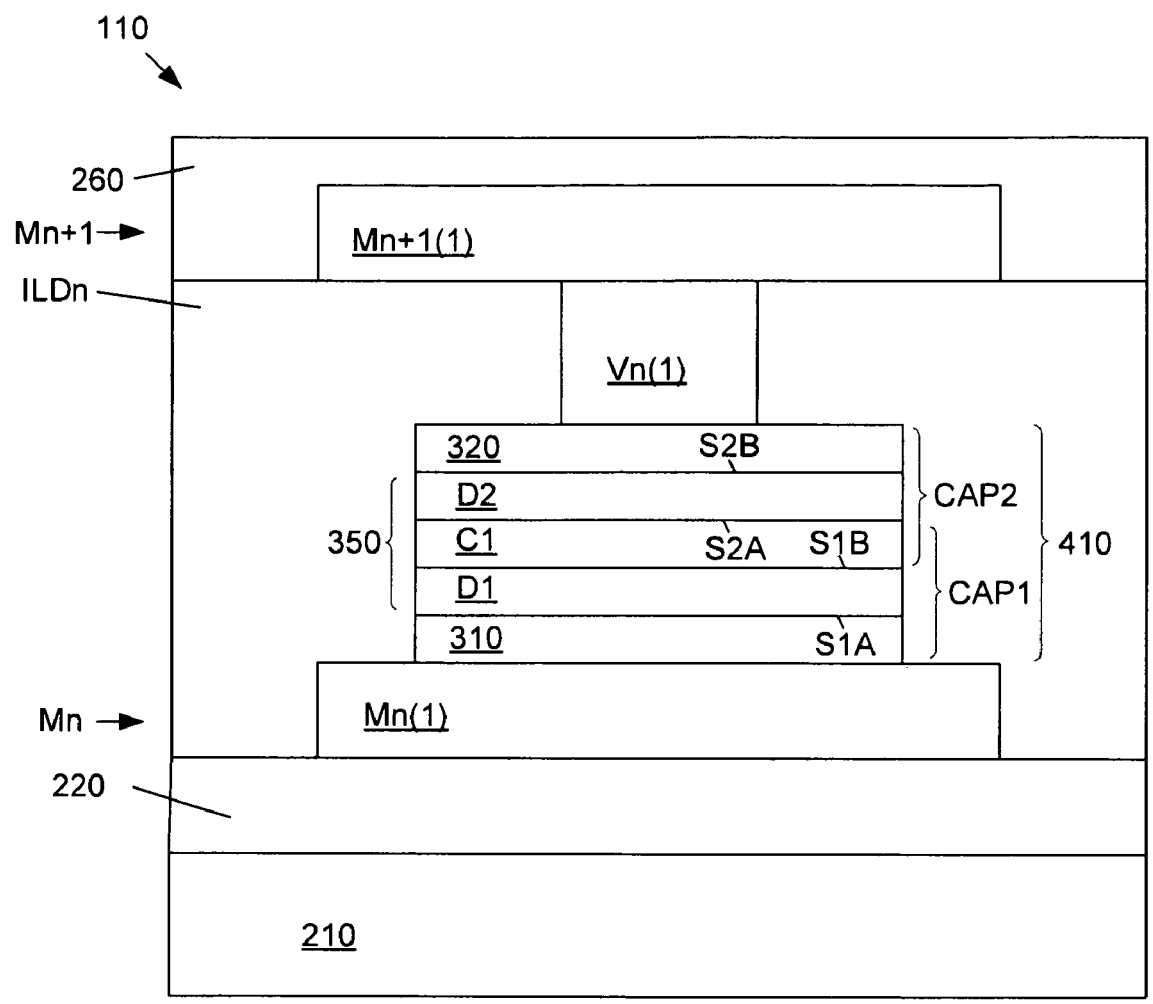
FIG. 1 shows an embodiment of a capacitor arrangement of the present invention.

FIG. 1 shows a semiconductor structure 110 which is an embodiment of the present invention. The semiconductor structure may, for example, represent a semiconductor chip, an integrated circuit or a semiconductor device. The semiconductor structure 110 includes a substrate 210. A layer 220 is disposed over the substrate. The layer 220 may include, without limitation, one or more dielectric layers (such as interlevel dielectric layers), one or more metallization levels, one or more conductive vias as well as one or more conductive contacts. An example of layer 220 is provided in FIG. 7 and is explained in more detail below. The semiconductor substrate 210 may include active areas, components or other material layers formed therein. The semiconductor structure 110 includes a capacitor arrangement 410. In one or more embodiments, the capacitor arrangement 410 may be an integrated capacitor arrangement which is integrated as part of a semiconductor chip or integrated circuit.

The substrate 210 may be any type of substrate. For example, the substrate may be a semiconductor substrate. In one or more embodiments, the substrate may be a silicon substrate. In an embodiment, the substrate may be a p-type substrate. The substrate may be a bulk mono-crystalline silicon substrate (or a grown thereon or otherwise formed therein), a of (110) silicon on a (100) silicon wafer, a silicon-on-insulator (SOI) substrate. The SOI substrate may, for example, be formed by a SIMOX process. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

The semiconductor structure 110 may include a plurality of metallization levels. The semiconductor structure 110 may include at least the metallization level Mn and the metallization level Mn+1 which is above the metallization level Mn. The metallization levels Mn and Mn+1 are adjacent metallization levels such that there is no other metallization level between the two. As an example, Mn may be Metal-1 while Mn+1 may be Metal-2. As another example, Mn may be Metal-2 while Mn+1 may be Metal-3.

In one or more embodiments, the metallization level Mn may be the lowest metallization level such as Metal-1. In another embodiments, the metallization level Mn may be, for example, Metal-2, Metal-3 or even higher. In one or more embodiments, there may be one or more additional metallization levels below Mn. As noted these metallization levels may be included within the layer 220.

In one or more embodiments, the metallization level Mn+1 may be the final, highest or top-most metallization level. However, in another embodiment, the semiconductor structure 110 may also include metallization levels above Mn+1.

Each of the metallization levels Mn and Mn+1 includes one or more conductive lines. As shown in FIG. 1, the metallization level Mn includes conductive line Mn(1). Likewise, the metallization level Mn+1 includes the conductive line Mn+1(1). Generally, the conductive lines may comprise any conductive material. In one or more embodiments, the conductive lines may comprise a metallic material such as a pure metal or a metal alloy.

A conductive layer 310 may be disposed over the conductive line Mn(1). The conductive layer 310 may be a barrier layer (for example, a bottom barrier layer). A dielectric layer D1 may be disposed over the conductive layer 310. A conductive layer C1 may be disposed over the dielectric layer D1. A dielectric layer D2 may be disposed over the conductive layer C1. A conductive layer 320 may be disposed over the dielectric layer C1. The conductive layer 320 may be a barrier layer (for example, a top barrier layer).

A conductive via Vn(1) may be disposed over the conductive layer 320. A conductive line Mn+1(1) may be disposed over the conductive via Vn(1). The conductive line Mn+1(1) is part of the metallization level Mn+1. In one or more embodiments, the metallization level Mn+1 may be the final metallization level of the semiconductor structure. In the embodiment shown in FIG. 1, the conductive structure 110 includes a conductive via Vn(1) which is electrically coupled between the metallization level Mn and the metallization level Mn+1. In the embodiment shown, the conductive via Vn(1) electrically couples the conductive line Mn+1(1) to the conductive layer 320.

The conductive line Mn(1), conductive layer 310, dielectric layer D1, conductive layer C1, dielectric layer D2, conductive layer 320 and the conductive via Vn(1) may all be embedded within one or more dielectric layers. In the embodiment shown in FIG. 1, the conductive line Mn(1), conductive layer 310, dielectric layer D1, conductive layer C1, dielectric layer D2, conductive layer 320 and the conductive via Vn(1) may all be embedded within an interlevel dielectric layer ILDn.

The conductive line Mn+1 may be embedded within a dielectric layer 260. In one or more embodiments, the dielectric layer 260 may, for example, represent another interlevel dielectric layer (e.g. interlevel dielectric layer ILDn+1) in the case that additional metallization levels are above the metallization level Mn+1. In this case, there may be one or more additional metallization levels as well as one or more dielectric layers above the dielectric layer 260.

In one or more embodiments, the dielectric layer 260 may also represent a final dielectric or passivation layer in the case that the metallization level Mn+1 is the final metallization level.

The semiconductor structure 110 includes a capacitor arrangement 410. The capacitor arrangement 410 includes a first capacitor CAP1 and a second capacitor CAP2 stacked above the first capacitor CAP1. The first capacitor CAP1 is electrically coupled in series with the second capacitor CAP2 between the first metallization level Mn and the second metallization level Mn+1.

The first capacitor CAP1 may include a bottom electrode 310, a dielectric layer D1 and a top electrode C1. The second capacitor CAP2 may include a bottom electrode C1, a dielectric layer D2 and a top electrode 320.

The conductive layer 310, the dielectric layer D1 and the conductive layer C1 may serve, respectively, as the bottom electrode, dielectric layer and top electrode of the first capacitor CAP1. Likewise, the conductive layer C1, the dielectric layer D2 and the conductive layer 320 may serve, respectively, as the bottom electrode, the dielectric layer and the top electrode of the second capacitor CAP2. The conductive layer C1 may serve as both the top electrode of the first capacitor CAP1 as well as the bottom electrode of the second capacitor CAP2.

In one or more embodiments, the conductive layer C1 may be electrically floating. In one or more embodiments, the conductive layer C1 may be electrically isolated from other elements of the semiconductor chip or integrated circuit. In one or more embodiments, the conductive layer C1 may be electrically isolated from the first metallization line Mn(1) as well as the second metallization line Mn+1(1).

In the embodiment shown in FIG. 1, the first capacitor CAP1 includes a first (e.g. bottom) electrode surface S1A, a second (e.g. top) electrode surface S1B, and a dielectric layer D1 between the first electrode surface S1A and the second electrode surface S1B. Likewise, the second capacitor CAP2 includes a first (e.g. bottom) electrode surface S2A, a second (e.g. top) electrode surface S2B, and a dielectric layer D2 between the first electrode surface S2A and the second electrode surface S2B.

The electrode surface S1A may be referred to as the first electrode surface of the capacitor arrangement 410, the electrode surface S1B may be referred to as the second electrode surface of the capacitor arrangement 410, the electrode surface S2A may be referred to as the third electrode surface of the capacitor arrangement 410, and the electrode surface S2B may be referred to as the fourth electrode surface of the capacitor arrangement 410.

In the embodiment shown in FIG. 1, the electrode surfaces S1B and S2A may be opposite surfaces of the conductive layer C1. In one or more embodiments, the electrode surface S1B and the electrode surface S2A may each be electrically floating. In one or more embodiments, the electrode surface S1B and the electrode surface S2A may electrically coupled to the same circuit node.

In one or more embodiments, the conductive layer C1 may consist essentially of a single homogeneous material. In one or more embodiments, the conductive layer C1 may comprise two or more different conductive materials. In one or more embodiments, the conductive layer C1 may itself comprise two or more conductive layers, each comprising a different conductive material. In one or more embodiments, the electrode surface S1B and the electrode surface S2A may each comprise the same conductive material. In one or more embodiments, the electrode surface S1B and the electrode surface S2A may each comprise a different conductive material.

In one or more embodiments, the first (or bottom) electrode surface S1A of the first capacitor CAP1 may be an electrode surface for only the first capacitor CAP1 (and no other capacitor). In one or more embodiments, the second (or top) electrode surface S2B of the second capacitor CAP2 may be an electrode surface for only the second capacitor CAP2 (and no other capacitor).

In one or more embodiments, the second (or top) electrode surface S1B of the first capacitor CAP1 may be an electrode surface for only the first capacitor CAP1 (and no other capacitor). In one or more embodiments, the first (or bottom) electrode surface S2A of the second capacitor CAP2 may be an electrode surface for only the second capacitor CAP2 (and no other capacitor).

Figure 2:
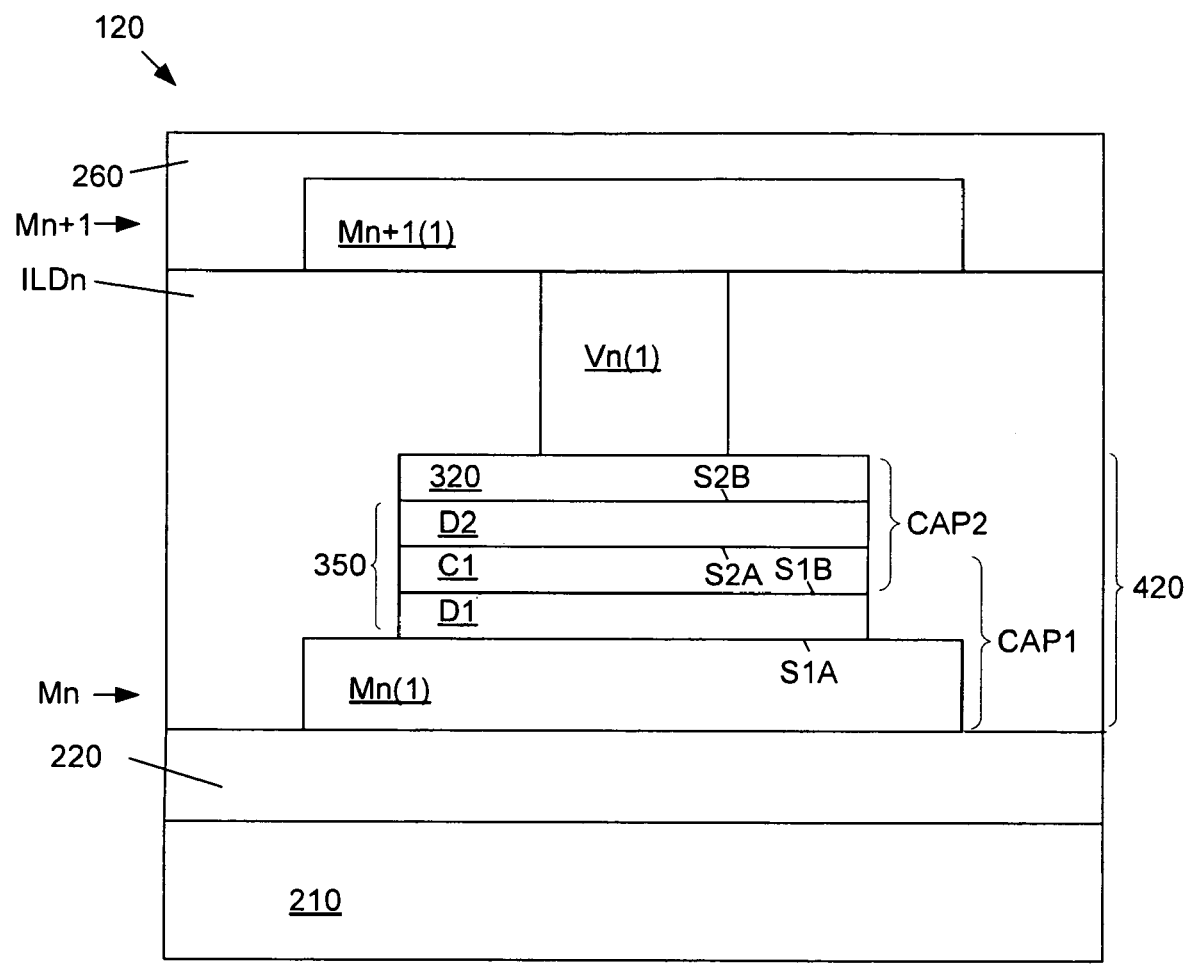
FIG. 2 shows an embodiment of a capacitor arrangement of the present invention.

Another embodiment of the invention is shown as the semiconductor structure 120 in FIG. 2. In this embodiment, the conductive layer 310 from FIG. 1 has been removed. The semiconductor structure 120 includes a capacitor arrangement 420. The capacitor arrangement 420 includes a first capacitor CAP1 and a second capacitor CAP2 stacked above the first capacitor CAP1. The first capacitor CAP1 is electrically coupled in series with the second capacitor CAP2 between the first metallization level Mn and the second metallization level Mn+1.

The first capacitor CAP1 may include a bottom electrode Mn(1), a dielectric layer D1 and a top electrode C1. The second capacitor CAP2 may include a bottom electrode C1, a dielectric layer D2 and a top electrode 320. The conductive line Mn(1), the dielectric layer D1 and the conductive layer C1 may serve, respectively, as the bottom electrode, dielectric layer and top electrode of the first capacitor CAP1. Likewise, the conductive layer C1, the dielectric layer D2 and the conductive layer 320 may serve as the bottom electrode, the dielectric layer and the top electrode of the second capacitor CAP2. The conductive layer C1 may serve as both the top electrode of the first capacitor CAP1 as well as the bottom electrode of the second capacitor CAP2.

In one or more embodiments, the conductive layer C1 may be electrically floating. In one or more embodiments, the conductive layer C1 may be electrically isolated from other elements of the semiconductor chip or integrated circuit. In one or more embodiments, the conductive layer C1 may be electrically isolated from the first metallization line Mn(1) as well as the second metallization line Mn+1(1).

In the embodiment shown in FIG. 2, the first capacitor CAP1 may include a first (e.g. bottom) electrode surface S1A, a second (e.g. top) electrode surface S1B, and a dielectric layer D1 between the first electrode surface S1A and the second electrode surface S2A. Likewise, the second capacitor CAP2 may include a first (e.g. bottom) electrode surface S2A, a second (e.g. top) electrode surface S2B, and a dielectric layer D2 between the first electrode surface S2A and the second electrode surface S2B.

The electrode surface S1A may be referred to as the first electrode surface of the capacitor arrangement 420, the electrode surface S1B may be referred to as the second electrode surface of the capacitor arrangement 420, the electrode surface S2A may be referred to as the third electrode surface of the capacitor arrangement 420, and the electrode surface S2B may be referred to as the fourth electrode surface of the capacitor arrangement 420.

In the embodiment shown in FIG. 2, the electrode surfaces S1B and S2A may be opposite surfaces of the conductive layer C1. In one or more embodiments, the electrode surface S1B and the electrode surface S2A may each be electrically floating. In one or more embodiments, the electrode surface S1B and the electrode surface S2A may electrically coupled to the same circuit node.

In one or more embodiments, the conductive layer C1 may consist essentially of a single homogeneous material. In one or more embodiments, the conductive layer C1 may comprise two or more different conductive materials. In one or more embodiments, the conductive layer C1 may itself comprise two or more conductive layers, each comprising a different conductive material. In one or more embodiments, the electrode surface S1B and the electrode surface S2A may each comprise the same conductive material. In one or more embodiments, the electrode surface S1B and the electrode surface S2A may each comprise a different conductive material.

In one or more embodiments, the first (or bottom) electrode surface S1A of the first capacitor CAP1 may be the electrode surface of only the first capacitor CAP1 (and no other capacitor). Likewise, in one or more embodiments, the second (or top) electrode surface S2B of said second capacitor CAP2 may be an electrode surface of only said second capacitor CAP2 (and no other capacitor).

Figure 3:
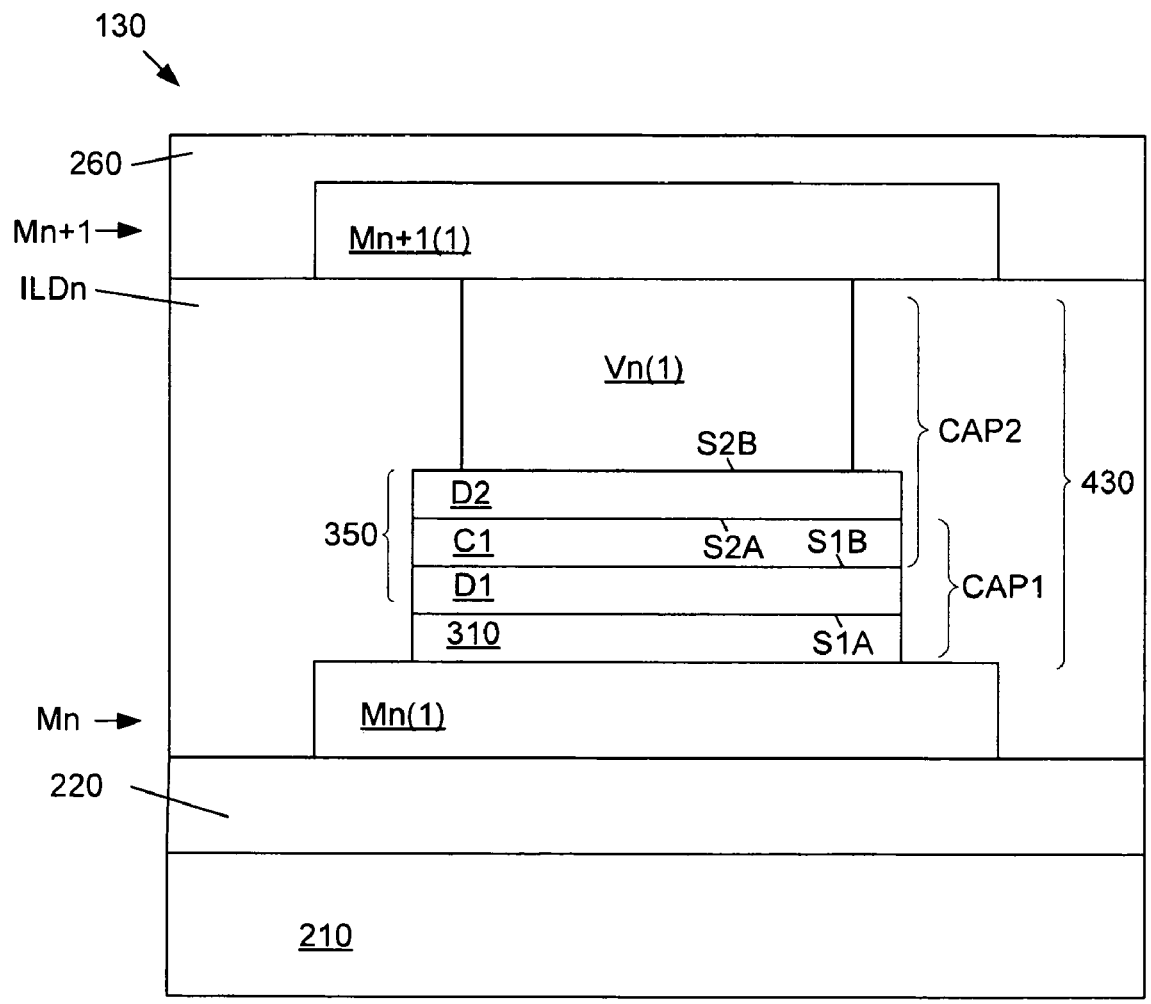
FIG. 3 shows an embodiment of a capacitor arrangement of the present invention.

Another embodiment of the invention is shown in FIG. 3. FIG. 3 shows a semiconductor structure 130. The semiconductor structure 130 may, for example, represent a semiconductor chip, integrated circuit or semiconductor device. In this embodiment, the conductive layer 320 from FIG. 1 has been removed but the conductive layer 310 remains. The semiconductor structure 130 includes a capacitor arrangement 430. The capacitor arrangement 430 includes a second capacitor CAP2 stacked above a first capacitor CAP1. The first capacitor CAP1 is electrically coupled in series with the second capacitor CAP2 between the first metallization layer Mn and the second metallization layer Mn+1.

The first capacitor CAP1 may include a bottom electrode 310, a dielectric layer D1 and a top electrode C1. The second capacitor CAP2 may include a bottom electrode C1, a dielectric layer D2 and a top electrode Vn(1). The conductive layer 310, the dielectric layer D1 and the conductive layer C1 may serve, respectively, as the bottom electrode, dielectric layer and top electrode of the first capacitor CAP1. The conductive layer C1, the dielectric layer D2 and the conductive via Vn(1) may serve, respectively, as the bottom electrode, the dielectric layer and the top electrode of the second capacitor CAP2. The conductive layer C1 may serve as both the top electrode of the first capacitor CAP1 as well as the bottom electrode of the second capacitor CAP2.

In one or more embodiments, the conductive layer C1 may be electrically floating. In one or more embodiments, the conductive layer C1 may be electrically isolated from other elements of the semiconductor chip or integrated circuit. In the embodiments shown, the conductive layer C1 may be electrically isolated from the first metallization line Mn(1) as well as the second metallization line Mn+1(1). In the embodiment shown in FIG. 3, the conductive via Vn(1) may be made wider than shown in the embodiments shown in FIGS. 1 and 2.

In one embodiment shown in FIG. 3, the first capacitor CAP1 may include a first (e.g. bottom) electrode surface S1A, a second (e.g. top) electrode surface S1B, and a dielectric layer D1 between the first electrode surface S1A and the second electrode surface S1B. Likewise, the second capacitor CAP2 may include a first (e.g. bottom) electrode surface S2A, a second (e.g. top) electrode surface S2B, and a dielectric layer D2 between the first electrode surface S2A and the second electrode surface S2B.

In the embodiment shown in FIG. 3, the electrode surface S1A may be a surface of conductive layer 310. Also, the electrode surface S2B may be a surface of conductive via Vn(1). In the embodiment shown in FIG. 3, the electrode surfaces S1B and S2A may be opposite surfaces of the conductive layer C1. In one or more embodiments, the electrode surface S1B and the electrode surface S2A may each be electrically floating. In one or more embodiments, the electrode surface S1B and the electrode surface S2A may electrically coupled to the same circuit node.

In one or more embodiments, the conductive layer C1 may consist essentially of a single homogeneous material. In one or more embodiments, the conductive layer C1 may comprise two or more different conductive materials. In one or more embodiments, the conductive layer C1 may itself comprise two or more conductive layers, each comprising a different conductive material. In one or more embodiments, the electrode surface S1B and the electrode surface S2A may each comprise the same conductive material. In one or more embodiments, the electrode surface S1B and the electrode surface S2A may each comprise a different conductive material.

In one or more embodiments, the first (or bottom) electrode surface S1A of the first capacitor CAP1 may be the electrode surface of only the first capacitor CAP1 (and no other capacitor). Likewise, in one or more embodiments, the second (or top) electrode surface S2B of the second capacitor CAP2 may be the electrode surface of only the second capacitor CAP2 (and no other capacitor).

The electrode surface S1A may be referred to as the first electrode surface of the capacitor arrangement 430, the electrode surface S1B may be referred to as the second electrode surface of the capacitor arrangement 430, the electrode surface S2A may be referred to as the third electrode surface of the capacitor arrangement 430, and the electrode surface S2B may be referred to as the fourth electrode surface of the capacitor arrangement 430.

Figure 4:
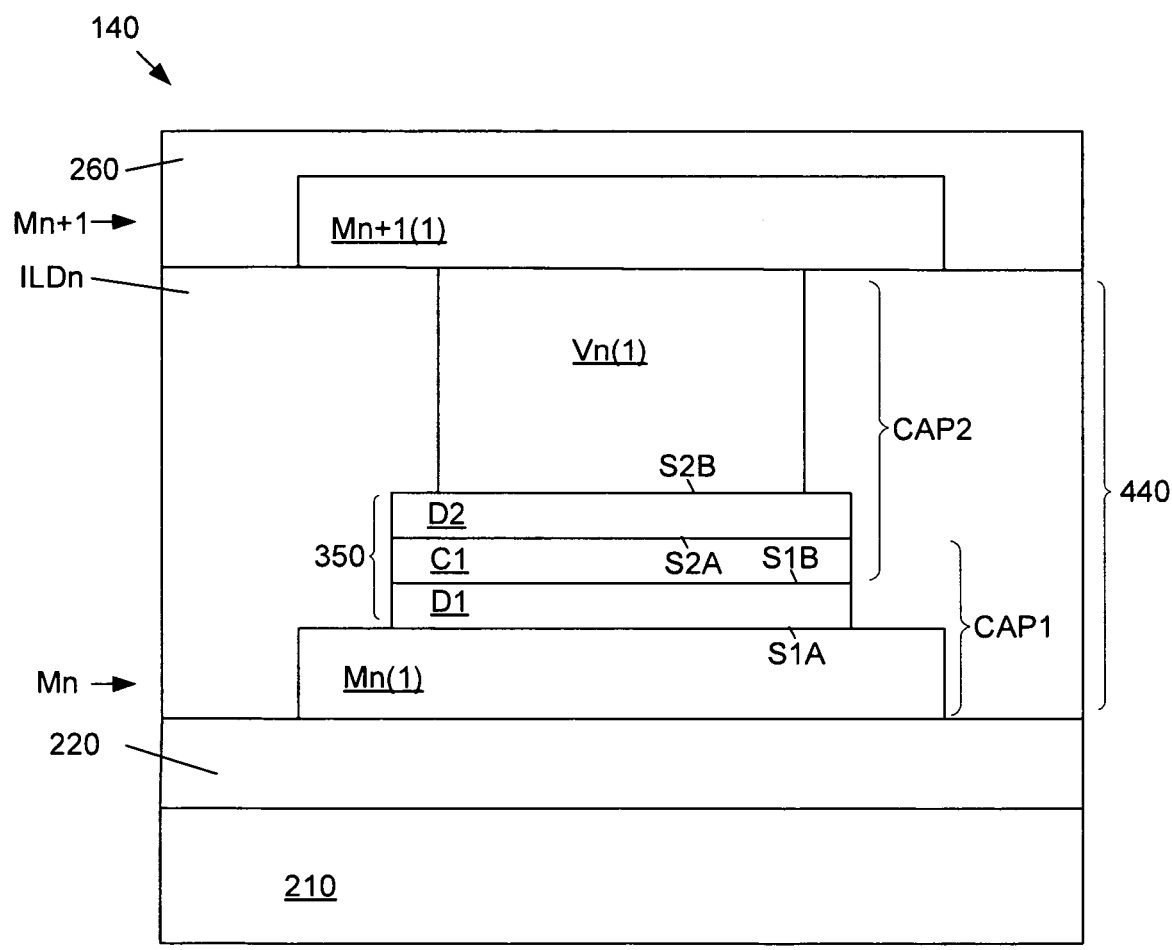
FIG. 4 shows an embodiment of a capacitor arrangement of the present invention.

Another embodiment of the invention is shown in FIG. 4. FIG. 4 shows a semiconductor structure 140. The semiconductor structure 140 may, for example, represent a semiconductor chip, an integrated circuit or a semiconductor device. In this embodiment, the conductive layer 320 from FIG. 1 as well as the conductive layer 320 from FIG. 1 have been removed. The semiconductor chip 140 includes a capacitor arrangement 440. The capacitor arrangement 440 includes a second capacitor CAP2 stacked above a first capacitor CAP1.

The first capacitor CAP1 is electrically coupled in series with the second capacitor CAP2 between the first metallization level Mn and the second metallization level Mn+1.

The first capacitor CAP1 may include a bottom electrode Mn(1), a dielectric layer D1 and a top electrode C1. The second capacitor CAP2 may include a bottom electrode C1, a dielectric layer D2 and a top electrode Vn(1). The conductive line Mn(1), the dielectric layer D1 and the conductive layer C1 may serve, respectively, as the bottom electrode, dielectric layer and top electrode of the first capacitor CAP1. Likewise, the conductive layer C1, the dielectric layer D2 and the conductive via Vn(1) may serve, respectively, as the bottom electrode, the dielectric layer and the top electrode of the second capacitor CAP2. It is seen that the conductive layer C1 may serve as both the top electrode of the first capacitor CAP1 as well as the bottom electrode of the second capacitor CAP2.

In one or more embodiments, the conductive layer C1 may be electrically floating. In one or more embodiments, the conductive layer C1 may be electrically isolated from other elements of the semiconductor chip or integrated circuit. In one or more embodiments, the conductive layer C1 may be electrically isolated from the first metallization line Mn(1) as well as the second metallization line Mn+1(1). In the embodiment shown in FIG. 4, the conductive via Vn(1) may be made wider than in the embodiments shown in FIG. 1 and FIG. 2.

In the embodiment shown in FIG. 4, the first capacitor CAP1 may include a first (e.g. bottom) electrode surface S1A, a second (e.g. top) electrode surface S1B, and a dielectric layer D1 between the first electrode surface S1A and the second electrode surface S1B. Likewise, the second capacitor CAP2 may include a first (e.g. bottom) electrode surface S2A, a second (e.g. top) electrode surface S2B, and a dielectric layer D2 between the first electrode surface S2A and the second electrode surface S2B.

In the embodiment shown in FIG. 4, the electrode surface S1A may be a surface of the conductive line Mn(1). Likewise, the electrode surface S2B may be a surface of the conductive via Vn(1). In the embodiment shown in FIG. 4, the electrode surfaces S1B and S2A may be opposite surfaces of the conductive layer C1. In one or more embodiments, the electrode surface S1B and the electrode surface S2A may each be electrically floating. In one or more embodiments, the electrode surface S1B and the electrode surface S2A may electrically coupled to the same circuit node.

In one or more embodiments, the conductive layer C1 may consist essentially of a single homogeneous material. In one or more embodiments, the conductive layer C1 may comprise two or more different conductive materials. In one or more embodiments, the conductive layer C1 may itself comprise two or more conductive layers, each comprising a different conductive material. In one or more embodiments, the electrode surface S1B and the electrode surface S2A may each comprise the same conductive material. In one or more embodiments, the electrode surface S1B and the electrode surface S2A may each comprise a different conductive material.

In one or more embodiments, the first (or bottom) electrode surface S1A of the first capacitor CAP1 may be the electrode surface of only the first capacitor CAP1 (and no other capacitor). Likewise, in one or more embodiments, the second (or top) electrode surface S2B of said second capacitor CAP2 may be an electrode surface of only said second capacitor CAP2 (and no other capacitor).

The electrode surface S1A may be referred to as the first electrode surface of the capacitor arrangement 440, the electrode surface S1B may be referred to as the second electrode surface of the capacitor arrangement 440, the electrode surface S2A may be referred to as the third electrode surface of the capacitor arrangement 440, and the electrode surface S2B may be referred to as the fourth electrode surface of the capacitor arrangement 440.

The capacitor arrangements shown in FIGS. 1 through 4 include a first capacitor CAP1 in series with a second capacitor CAP2 between a first metallization level Mn and a second metallization level Mn+1. The first and second metallization levels may be adjacent levels (such as Metal-1 is adjacent to Metal-2, Metal-2 is adjacent to Metal-3, etc). In the embodiments shown, no other metallization level is between the first metallization level Mn and the second metallization level Mn+1. As an example, Mn may correspond to Metal-1 while Mn+1 may correspond to Metal-2. As another example, Mn may correspond to Metal-2 while Mn+1 may correspond to Metal-3.

Figure 5:
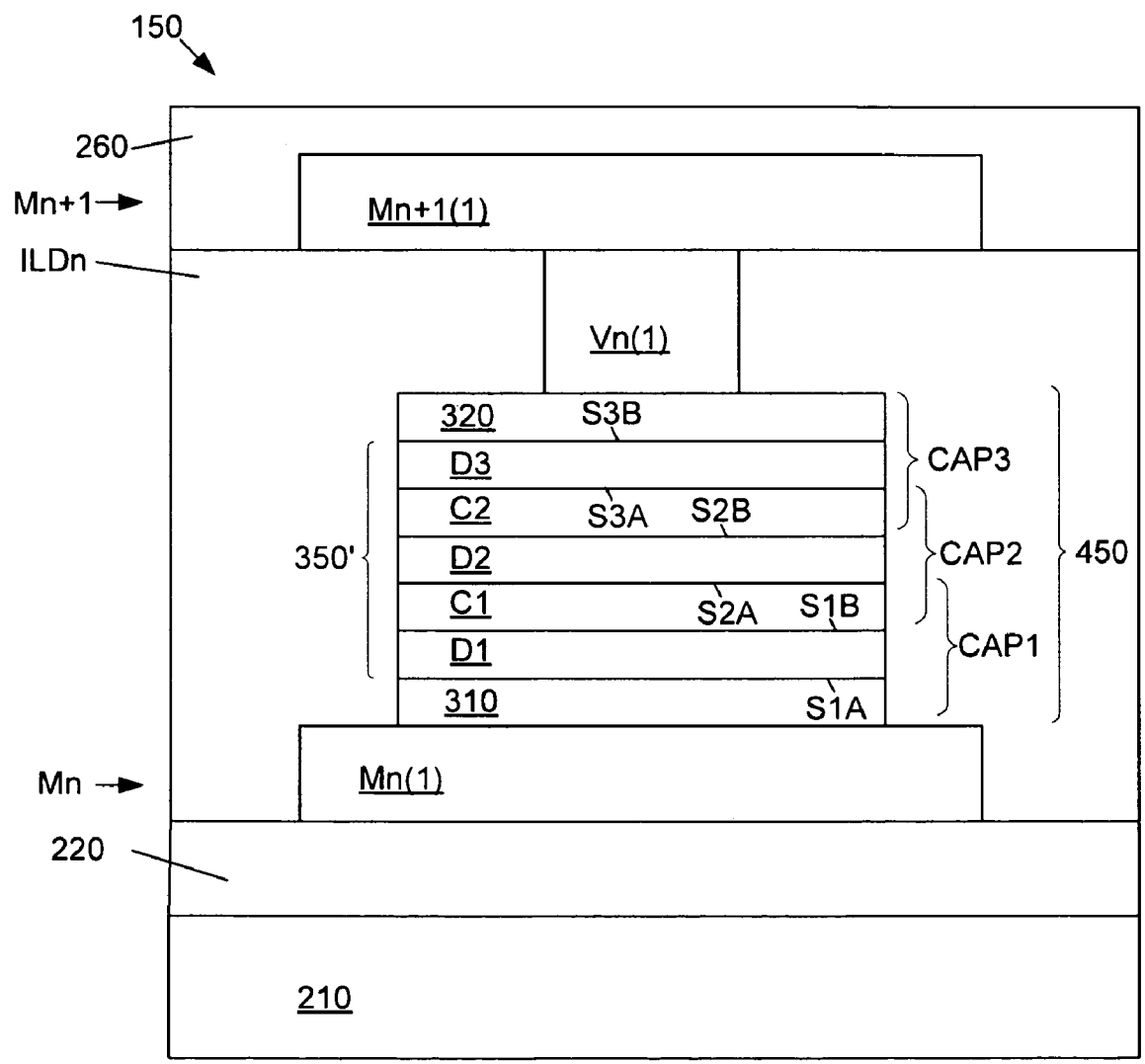
FIG. 5 shows an embodiment of a capacitor arrangement of the present invention.

In other embodiments, of the invention, it is possible to have more than two stacked capacitors electrically coupled in series. Another embodiment of the invention is shown in FIG. 5. FIG. 5 shows a semiconductor structure 150. The semiconductor structure 150 may, for example, represent a semiconductor chip, an integrated circuit or a semiconductor device. FIG. 5 includes a capacitor arrangement 450 that includes three stacked capacitors CAP1, CAP2, CAP3 coupled in series between a first metallization level Mn and a second metallization level Mn+1. Metallization level Mn and metallization level Mn+1 may be adjacent levels.

The first capacitor CAP1 may include a bottom electrode 310, a dielectric layer D1 and a top electrode C1. The second capacitor CAP2 may include a bottom electrode C1, a dielectric layer D2 and a top electrode C2. The third capacitor CAP3 may include a bottom electrode C2, dielectric layer D3 and a top electrode 320. The conductive layer 310, the dielectric layer D1 and the conductive layer C1 may serve, respectively, as the bottom electrode, dielectric layer and top electrode of the first capacitor CAP1. Likewise, the conductive layer C1, the dielectric layer D2 and the conductive layer C2 may serve, respectfully, as the bottom electrode, the dielectric layer and the top electrode of the second capacitor CAP2. Likewise, it is seen that the conductive layer C2, the dielectric layer D3 and the conductive layer 320 may serve, respectfully, as the bottom electrode, dielectric layer and top electrode of the capacitor CAP3.

The conductive layer C1 may serve as the top electrode of capacitor CAP1 as well as the bottom electrode of capacitor CAP2. The conductive layer C2 may serve as the top electrode of capacitor CAP2 as well as the bottom electrode of capacitor CAP3.

In the embodiment shown in FIG. 5, the conductive layer C1 as well as the conductive layer C2 may each be electrically floating. In one or more embodiments, the conductive layers C1 and C2 may be electrically isolated from each other. In one or more embodiments, each of the conductive layers C1 and C2 may be electrically isolated from each other as well as from other elements of the semiconductor chip or integrated circuit. In one or more embodiments, each conductive layer C1, C2, may be electrically isolated from the first metallization line Mn(1) as well as the second metallization line Mn+1 (1).

In the embodiment shown in FIG. 5, the first capacitor CAP1 may include a first (e.g. bottom) electrode surface S1A, a second (e.g. top) electrode surface S1B, and a dielectric layer D1 between the first electrode surface S1A and the second electrode surface S2A. Likewise, the second capacitor CAP2 may include a first (e.g. bottom) electrode surface S2A, a second (e.g. top) electrode surface S2B, and a dielectric layer D2 between the first electrode surface S2A and the second electrode surface S2B. Likewise, the third capacitor CAP3 includes a first (e.g. bottom) electrode surface S3A, a second (e.g. top) electrode surface S3B, and a dielectric layer D3 between the first electrode surface S3A and the second electrode surface S3B.

In the embodiment shown in FIG. 5, the electrode surface S1A is a surface of conductive layer 310. Also, the electrode surface S3B is a surface of conductive layer 320. In the embodiment shown in FIG. 5, the electrode surfaces S1B and S2A may be opposite surfaces of the conductive layer C1. Likewise, the conductive surfaces S2B and S3A may be opposite surfaces of the conductive layer C2. In one or more embodiments, the electrode surface S1B and the electrode surface S2A may each be electrically floating. In one or more embodiments, the electrode surface S1B and the electrode surface S2A may electrically coupled to the same first circuit node. In one or more embodiments, the electrode surface S2B and the electrode surface S3A may each be electrically floating. In one or more embodiments, the electrode surface S2B and the electrode surface S3A may electrically coupled to the same second circuit node.

In one or more embodiments, the conductive layer C1 may consist essentially of a single homogeneous material.

In one or more embodiments, the conductive layer C1 may comprise two or more different conductive materials. In one or more embodiments, the conductive layer C1 may itself comprise two or more conductive layers, each comprising a different conductive material. In one or more embodiments, the electrode surface S1B and the electrode surface S2A may each comprise the same conductive material. In one or more embodiments, the electrode surface S1B and the electrode surface S2A may each comprise a different conductive material.

In one or more embodiments, the conductive layer C2 may consist essentially of a single homogeneous material. In one or more embodiments, the conductive layer C2 may comprise two or more different conductive materials. In one or more embodiments, the conductive layer C2 may itself comprise two or more conductive layers, each comprising a different conductive material. In one or more embodiments, the electrode surface S2B and the electrode surface S3A may each comprise the same conductive material. In one or more embodiments, the electrode surface S2B and the electrode surface S3A may each comprise a different conductive material.

In one or more embodiments, the first (or bottom) electrode surface S1A of the first capacitor CAP1 may be the electrode surface of only the first capacitor CAP1 (and no other capacitor). Likewise, in one or more embodiments, the second (or top) electrode surface S3B of the third capacitor CAP3 may be an electrode surface of only said third capacitor CAP3 (and no other capacitor).

Other embodiments of the invention may be formed by modifying the embodiment shown in FIG. 5. For example, either conductive layer 310 and/or conductive layer 320 may be removed from the embodiment shown in FIG. 5 to form other embodiments.

Figure 6:
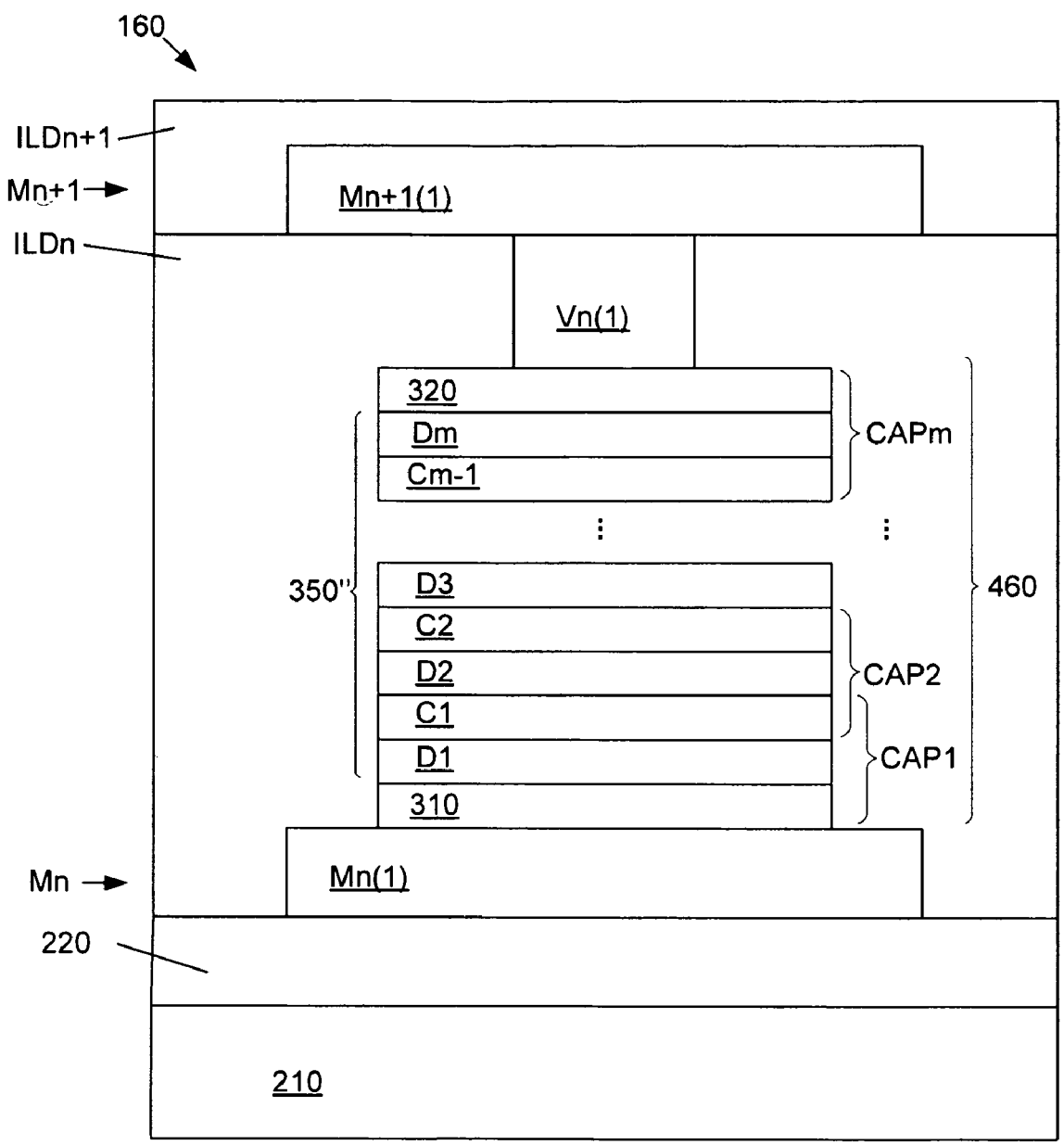
FIG. 6 shows an embodiment of a capacitor arrangement of the present invention.

The concept shown in FIG. 5 may be further extended to form a stack of m capacitors coupled in series between a metallization level Mn and a metallization level Mn+1. This is shown in FIG. 6 which shows a semiconductor structure 160 that includes a capacitor arrangement 460 that includes a stack of m capacitors CAP1, CAP2, ..., CAPm which are all coupled in series between the metallization level Mn and the metallization level Mn+1. The embodiment shown in FIG. 6 may be modified by removing one or both of the conductive layers 310, 320. In one or more embodiments, each of the conductive layers C1, C2, ..., Cm-1 may be electrically floating. In one or more embodiments, each of the conductive layers C1, C2, ..., Cm-1 may be electrically isolated from each other.

Referring again to the embodiments shown in FIG. 1 through FIG. 4, it is seen that the capacitor arrangements 410, 420, 430 and 440 may all include a layer stack 350. The stack 350 includes a dielectric layer D1, a conductive layer C1 and a dielectric layer D2. Referring to FIG. 5, it is seen that the capacitor arrangement 450 includes a layer stack 350' that comprises a dielectric layer D1, a conductive layer C1, a dielectric layer D2, a conductive layer C2 and a dielectric layer D3. Likewise, referring to the embodiment of FIG. 6 it is seen that the capacitor arrangement 460 includes a layered stack 350" which is an alternating arrangement of dielectric and conductive layer that begins and ends with a dielectric layer. The stack 350" includes dielectric layers D1, D2, D3, ..., Dm. The stack includes conductive layer layers C1, C2, ..., Cm-1. The number "m" may be 4, 5, 6 or greater.

Figure 7:
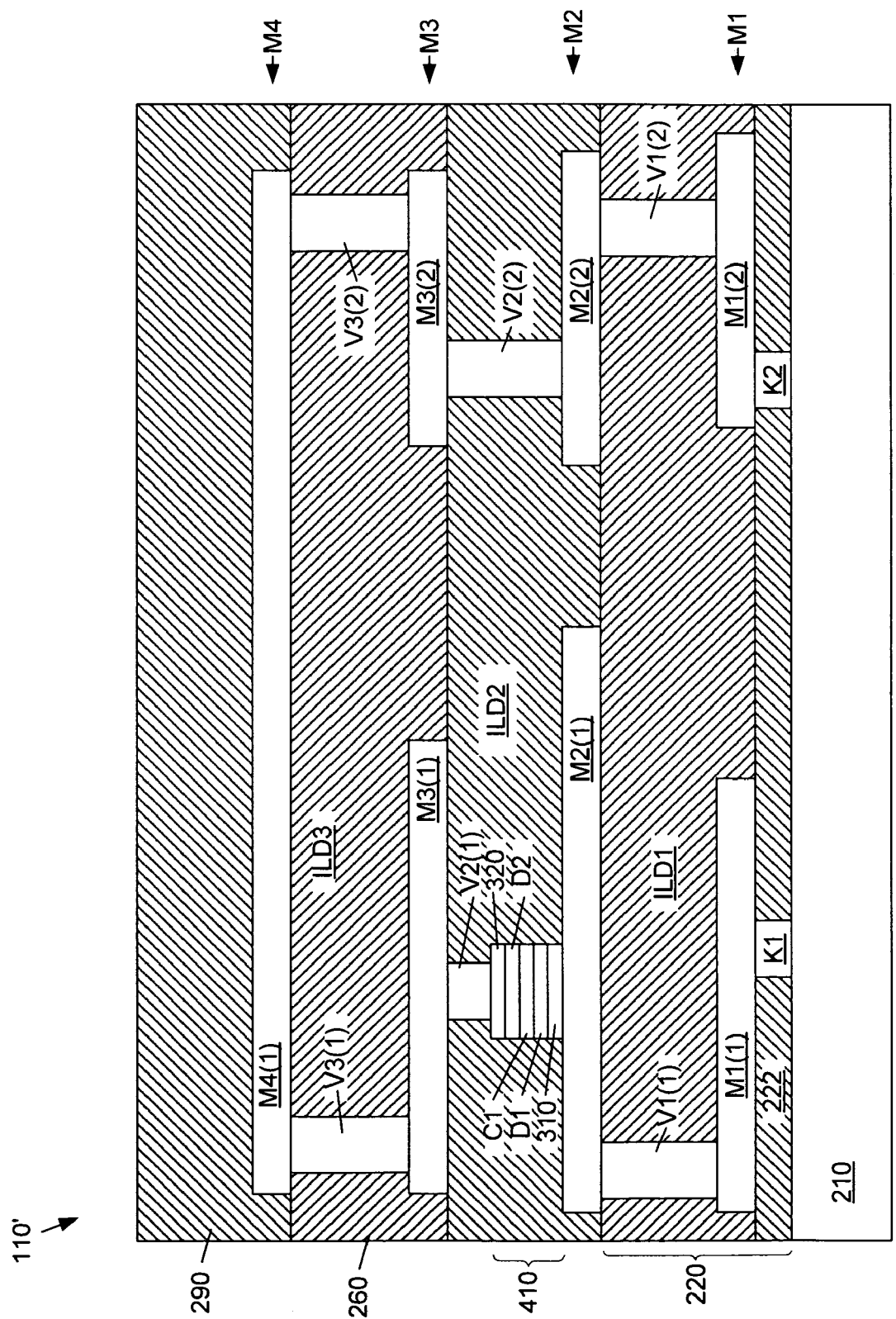
FIG. 7 shows an embodiment of a semiconductor chip of the present invention.

FIG. 7 shows a semiconductor structure 110' which is an example of the embodiment shown in FIG. 1. The semiconductor structure 110' may, for example, represent a semiconductor chip, an integrated circuit or a semiconductor device. The semiconductor structure 110' includes a semiconductor substrate 210. Overlying the substrate 210 is a layer 220. In the embodiment shown, the layer 220 comprises a dielectric layer 222 overlying the substrate 210 and an interlevel dielectric layer ILD1 overlying the dielectric layer 222. The layer 220 further includes conductive contacts C1, C2. The layer 220 further includes a metallization level M1 that includes conductive line M1(1) and a conductive line M1(2)). The layer 220 further includes conductive vias V1(1), V1(2).

The conductive contacts C1, C2 are embedded within the dielectric layer 222. The first metallization level M1 is formed over the dielectric layer 222. The first metallization level M1 includes conductive line M1(1) and conductive line M1(2). The conductive lines M1(1), M1(2) are embedded within a first interlevel dielectric layer ILD1. Conductive vias V1(1) and V1(2) are also embedded within the interlevel dielectric layer ILD1.

A second metallization level M2 is formed over the interlevel dielectric layer ILD1. The second metallization level M2 includes conductive lines M2(1) and M2(2). The conductive lines M2(1) and M2(2) are embedded within a second interlevel dielectric layer ILD2. Conductive vias V2(1), V2(2) as well as conductive layer 310, dielectric layer D1, conductive layer C1 are embedded within the dielectric layer ILD2.

A third metallization level M3 is formed over the interlevel dielectric layer ILD2. The third metallization level M3 includes conductive lines M3(1) and M3(2). The conductive lines M3(1) and M3(2) are embedded within a dielectric layer 260. The dielectric layer 260 corresponds to a third interlevel dielectric layer ILD3. The conductive vias V3(1), V3(2) are also embedded within dielectric layer 260.

A fourth metallization level M4 is disposed over the interlevel dielectric layer ILD3. The fourth metallization level M4 includes the conductive line M4(1). The conductive line M4(1) is embedded within a dielectric layer 290. The fourth metallization level M4 may be the final metal level for the semiconductor chip 110'.

Referring to FIG. 7, conductive via V1(1) electrically couples conductive line M1(1) to conductive line M2(1). Conductive via V2(2) electrically couples conductive line M1(2) to conductive line M2(2).

Likewise, conductive via V2(2) electrically couples conductive line M2(2) to conductive line M3(2). Likewise, conductive via V3(1) electrically coupled conductive line M3(1) to conductive line M4(1) and conductive via V3(2) electrically couples conductive line M3(2) to conductive line M4(1).

The semiconductor structure 110' includes a capacitor arrangement 410 (as described above with respect to FIG. 1). The capacitor arrangement includes a first capacitor CAP1 and a second capacitor CAP2 stacked above the first capacitor CAP1. First and second capacitors CAP1 and CAP2 are electrically coupled in series between the metallization level M2 and the metallization level M3.

Still referring to FIG. 7, first capacitor CAP1 includes conductive layer 310 as the bottom electrode, a dielectric layer D1 as the capacitor dielectric and a conductive layer C1 as a top electrode. Second capacitor CAP2 includes conductive layer C1 as the bottom electrode, dielectric layer D2 as the capacitor dielectric and conductive layer 320 as the top electrode. In one or more embodiments, the conductive layer 310 may be a barrier layer. Likewise, in one or more embodiments, the conductive layer 320 may be a barrier layer. It is seen that the conductive layer 310 may also serve as a first electrode for the capacitor arrangement 410 as well as the bottom electrode for the capacitor CAP1. Likewise, the conductive layer 320 may serve as a second electrode for the capacitor arrangement 410 as well as the top electrode for the capacitor CAP2.

FIG. 7 shows how the capacitor arrangement 410 may be electrically coupled between a first portion of the substrate 210 and a second portion of same substrate 210 of the same chip. It may also be possible to couple one or more of the electrodes of the capacitor arrangement 410 to other chips. More generally, the first electrode 310 of the capacitor arrangement 410 may be electrically coupled to a first node on the same chip as the capacitive device or to a first node on a different chip from the capacitive device. Likewise, the second electrode 320 of the capacitor arrangement 410 may be electrically coupled to a second node on the same semiconductor structure (for example, semiconductor chip, integrated or semiconductor device) as the capacitor or to a node on a different chip from the capacitor arrangement.

Figure 8A:
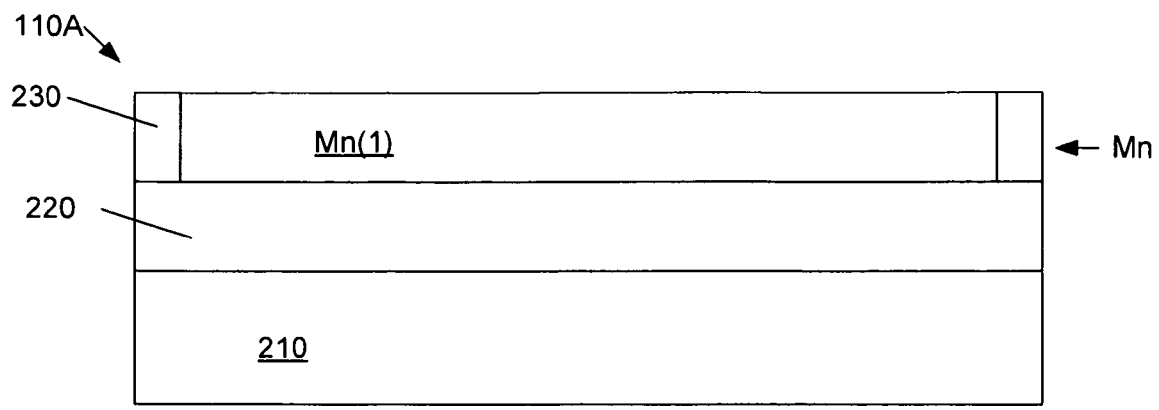
FIGS. 8A through 8F shows a method of making a capacitor arrangement in accordance with an embodiment of the present invention.
Figure 8B:
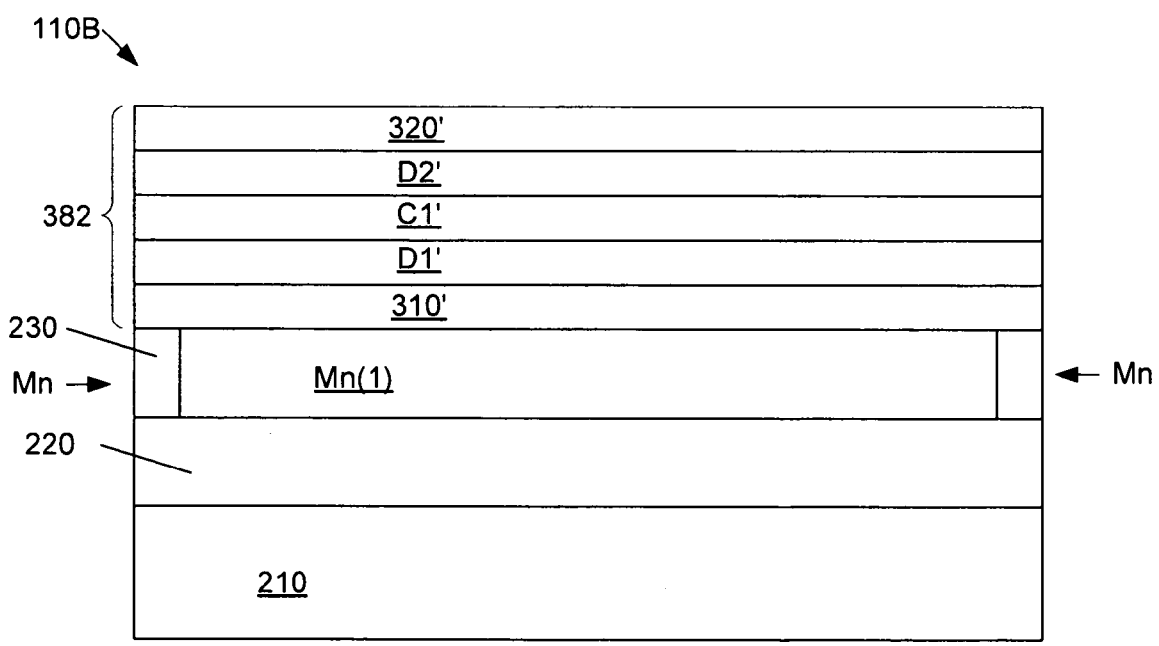
Figure 8C:
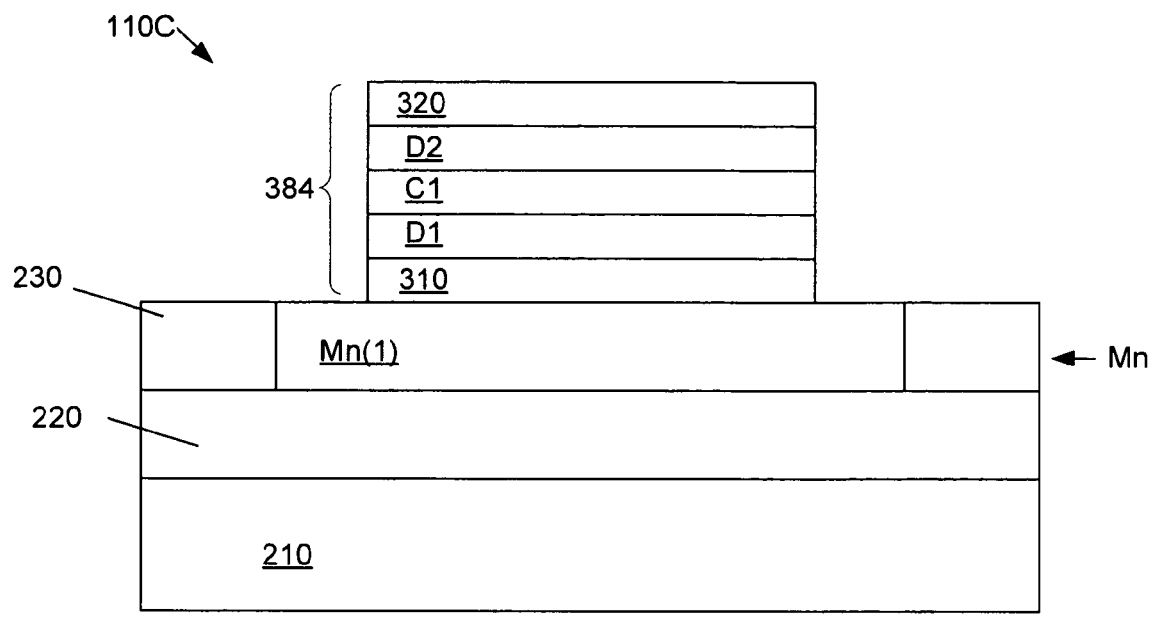
Figure 8D:
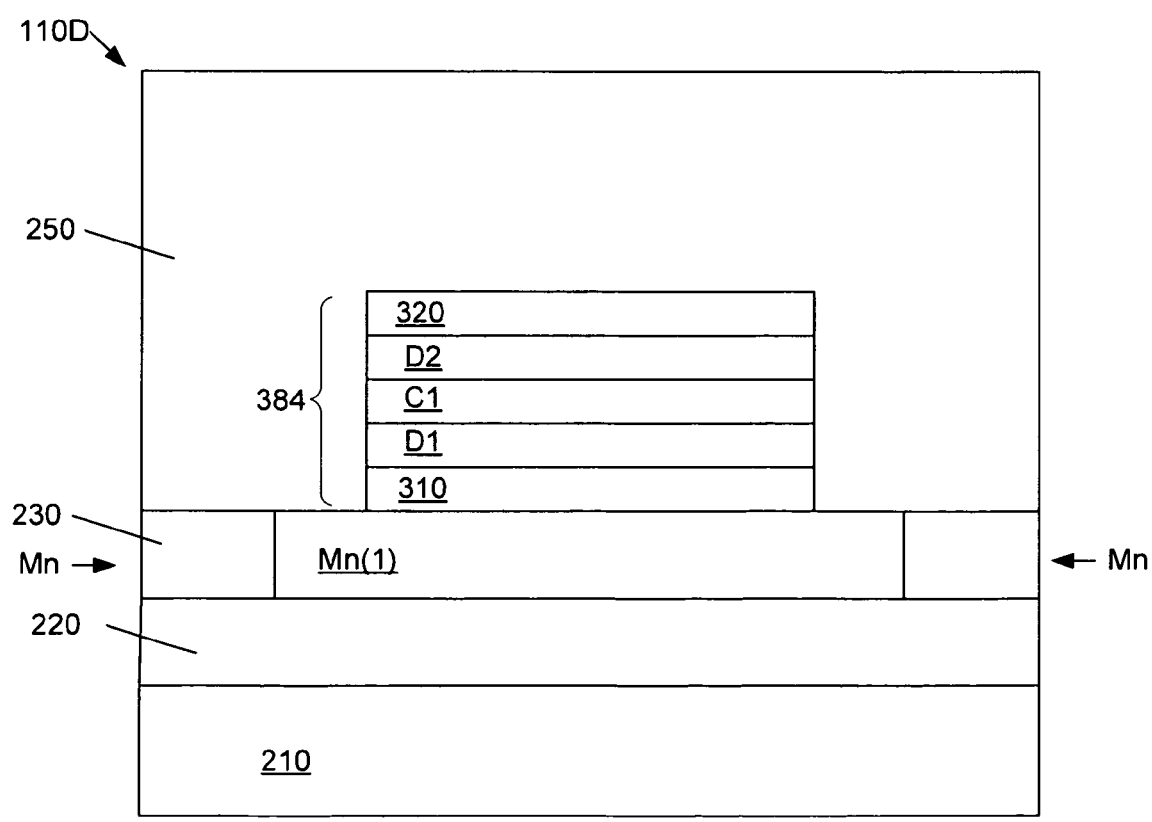
Figure 8E:
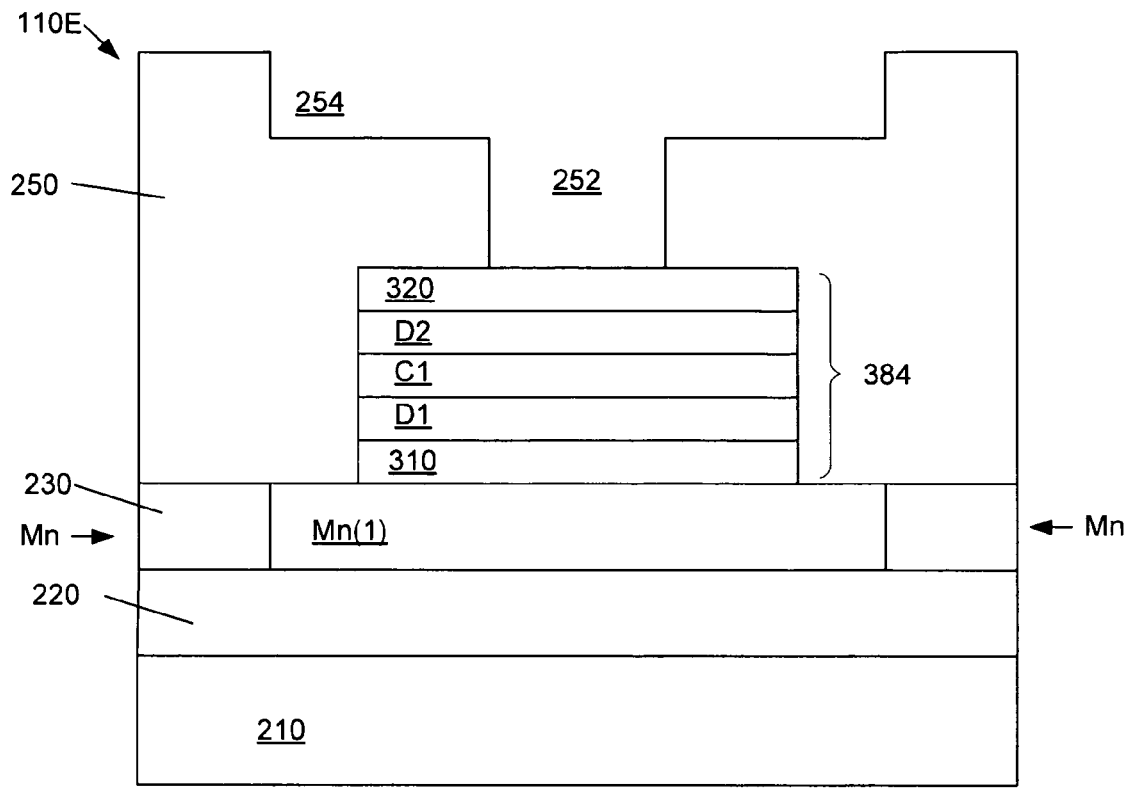
Figure 8F:
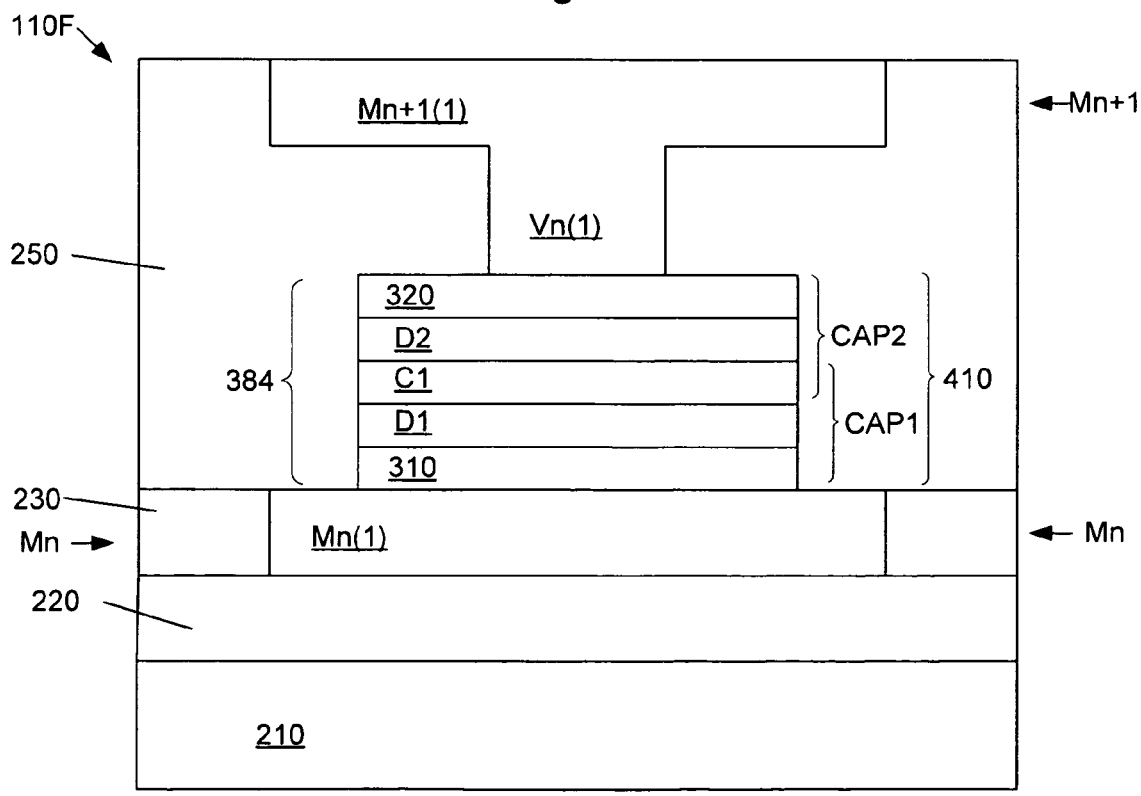

FIGS. 8A through 8F show a process for making the semiconductor structure 110F shown in FIG. 8F. The process is an embodiment of the present invention. The semiconductor structure 110F is also an embodiment of the present invention. The semiconductor structure 110F may, for example, represent a semiconductor chip or an integrated circuit. FIG. 8A shows a semiconductor structure 110A that includes a substrate 210 and layer 220 disposed over the substrate 210. A conductive line Mn(1) is disposed over the layer 220 and embedded in a dielectric layer 230.

Referring to FIG. 8B, the conductive layer 310' is formed over the structure 110A from FIG. 8A, the dielectric layer D1' is formed over the conductive layer 310', the conductive layer C1' is formed over the dielectric layer D1', the dielectric layer D2' is formed over the conductive layer C1' and the conductive layer 320' is formed over the dielectric layer D2'. This results in the formation of a layer stack 382 over the structure 110A from FIG. 8A to form the structure 110B in FIG. 8B.

Referring to FIG. 8C, the layer stack 382 from FIG. 8B may then be etched to form the etched stack 384 shown in FIG. 8C. In one or more embodiments, the stack 382 may be etched using a single masking step to form the etched stack 384 shown in FIG. 8C. The etch results in the structure 110C shown in FIG. 8C. It is noted that the layers 310, D1, C1, D2 and 320 are etched versions of the layers 310', D1', D2' and 320' shown in FIG. 8B. In one or more embodiments, the etch performed may be a dry etch. An example of a dry etch is a plasma etch. In one or more embodiments, the etch may include at least one etch chemistry. In one or more embodiments, the etch may include two or more etch chemistries.

Referring to FIG. 8D, a dielectric layer 250 may then formed over the structure 110C from FIG. 8C to form the structure 110D shown in FIG. 8D.

Referring to FIG. 8E, the dielectric layer 250 may then be etched to form the structure 110E shown in FIG. 8E. The structure 110E shown in FIG. 8E includes a first opening 252 and a second opening 254 within the dielectric layer 250. The first opening 252 may be a via opening and may be in the form of a hole (for example, round, oval, square or rectangular). The second opening may be a trench opening in the form of a trench. The openings may be formed within the dielectric 250 using an etch process associated with a damascene process such as a dual damascene process.

The FIG. 8F shows a structure 100F. Referring to FIG. 8F, the opening 252 and the opening 254 may then be filled with a conductive material to form the conductive via Vn(1) and the conductive line Mn+1(1). The conductive material may be a metallic material. The filling of the opening 252 and the opening 254 may be performed by first depositing a metallic seed layer over the surfaces of the openings 252, 254 and then depositing a metallic material into the openings 252, 254 by, for example, by using an electroplating process. In one or more embodiments, the metallic material may be pure copper or a copper alloy (such as a copper-aluminium alloy).

Regardless of the process used, it is possible, in one or more embodiments, that the conductive via Vn(1) and/or the conductive line Mn+1(1) may end up being either pure copper or a copper alloy (such as a copper-aluminum alloy). In one or more embodiments, the conductive lines Mn(1) as well as Mn+1(1) may be pure copper or a copper alloy (such as copper-aluminum alloy). In this case, in or more embodiments, it is possible that the conductive via Vn(1) may be formed of the same material as the conductive lines. In one or more embodiments, the conductive via Vn(1) may also be formed of either pure copper or a copper alloy.

In another embodiment of the invention, it is possible that the upper conductive line Mn+1(1) as well as the conductive via Vn(1) comprise pure copper or a copper alloy. However, the lower conductive line M(1) may comprise a material that is different from either pure copper or a copper alloy. For example, the lower conductive line Mn(1) may comprise pure aluminium or an aluminium alloy.

In another embodiment of the invention, it is possible that neither the upper conductive line Mn+1(1) nor the lower conductive line Mn(1) comprise either pure copper or a copper alloy. Instead it is possible, the both conductive lines comprise another conductive or metallic material. For example, in an embodiment, the lower conductive line Mn(1) as well as the upper conductive line Mn+1(1) comprise either pure aluminium or an aluminium alloy. In this case, it is possible that the conductive via Vn(1) may comprise pure tungsten or a tungsten alloy.

Figure 9A:
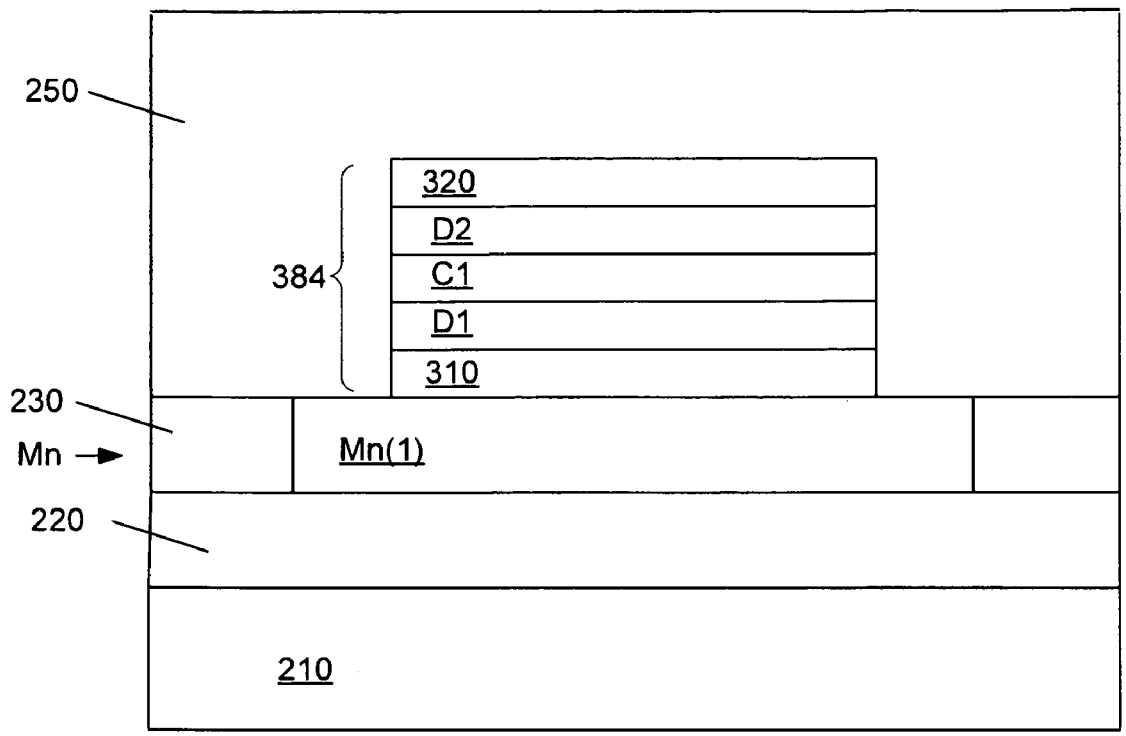
FIG. 9A through 9D shows a method of making a capacitor arrangement in accordance with an embodiment of the present invention.
Figure 9B:
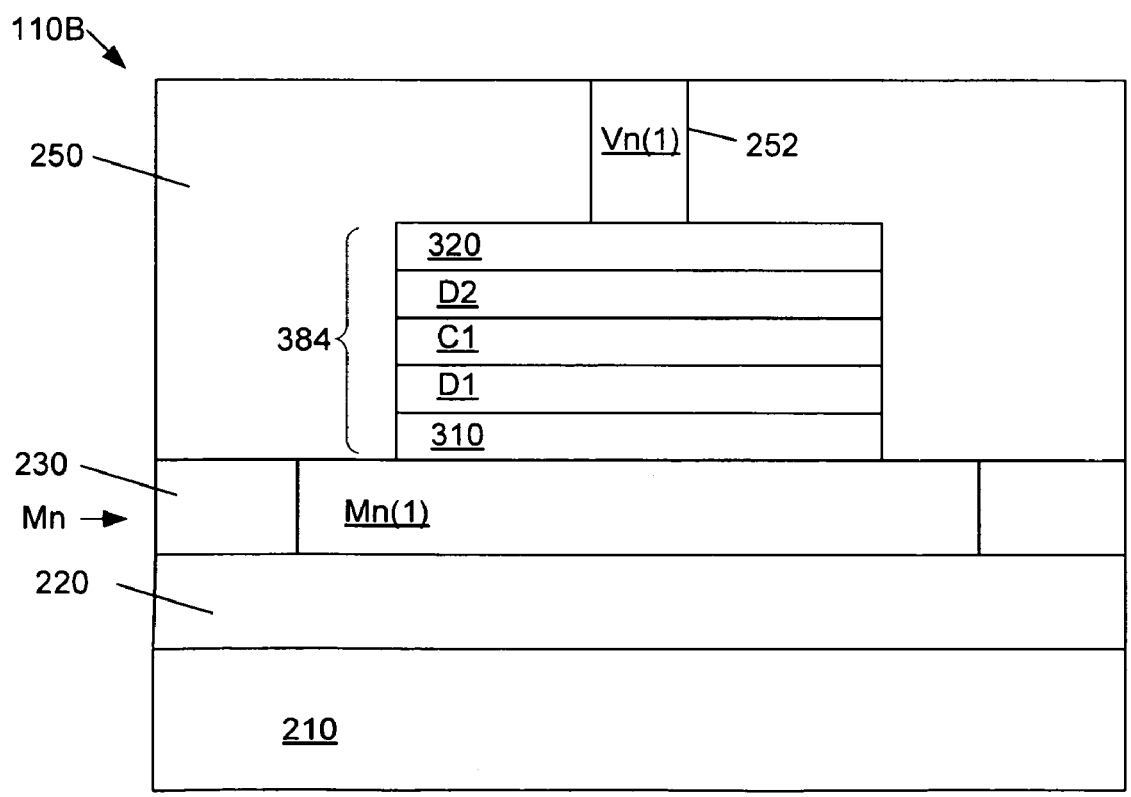
Figure 9C:
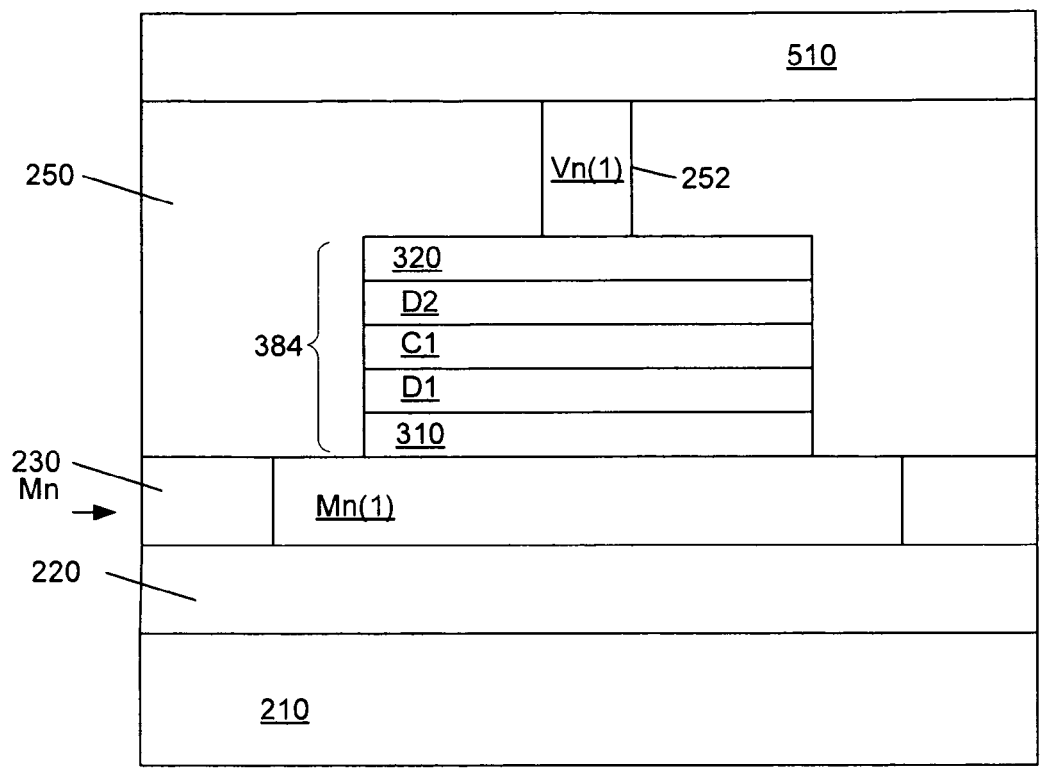
Figure 9D:
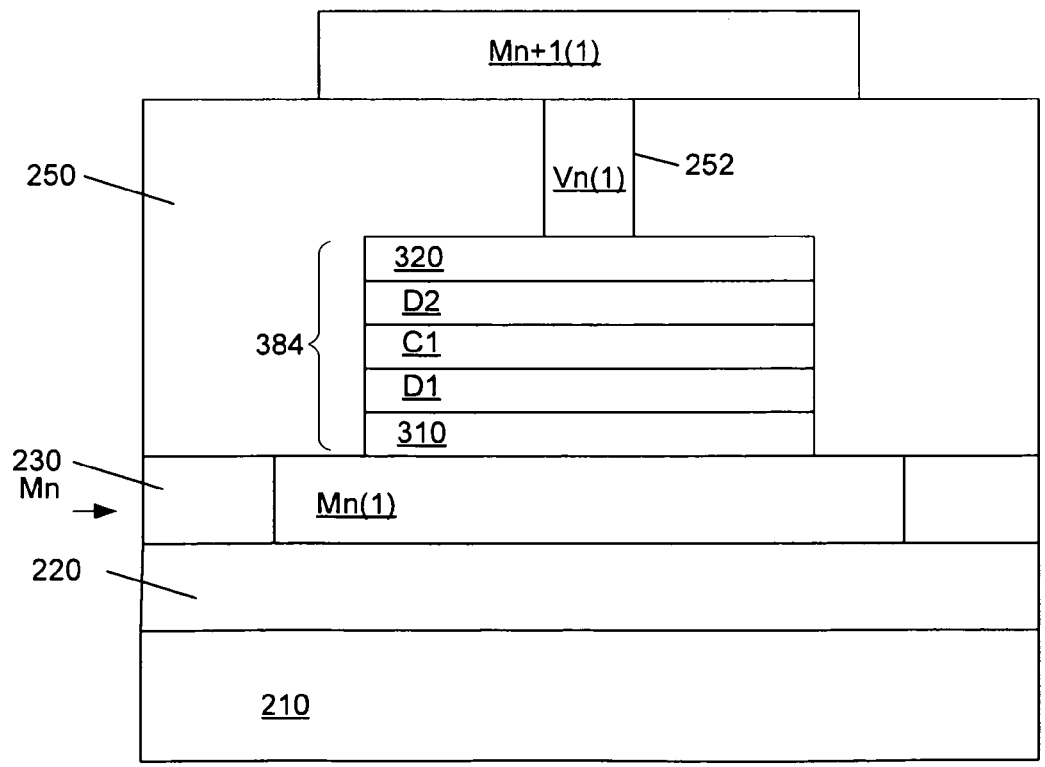

In one or more embodiments, the conductive via Vn(1) as well as the conductive line Mn+1(1) may be formed by a different process which is also an embodiment of the present invention. This process is shown in FIGS. 9A through 9D. The structure of FIG. 9A is similar to that of the structure 110D shown in FIG. 8D. FIG. 9A shows the layer stack 384 covered by a dielectric layer 250. Referring to FIG. 9B, it is seen that it is possible that a via opening 252 be formed in the dielectric layer 250. A conductive material may then be deposited within the opening 252 to form the conductive via Vn(1). Referring to FIG. 9C, a conductive layer 510 may then be deposited over the conductive via Vn(1) and, optionally, over the dielectric layer 250. Referring to FIG. 9C, the conductive layer 510 may then be etched to form the conductive line Mn+1(1) which is part of the metallization level Mn+1. In one or more embodiments, it is possible that the process shown in FIGS. 9A through 9D may be well suited when the conductive lines Mn(1) and Mn+1(1) comprise pure aluminium or an aluminium alloy. It is noted that the process depicted is FIGS. 9A through 9D is an embodiment of the present invention. Also, the semiconductor structure shown in FIG. 9D is an embodiment of the present invention.

In one or more embodiments, the layer stack 384 shown, for example, in FIGS. 8C-F as well as in FIGS. 9A-D may instead be formed without the either conductive layer 310 and/or without the conductive layer 320. These alternative layer stacks may also be formed using a single masking step. Likewise, in one or more embodiments, it is possible that the layer stack 384 may be modified by using additional conductive and dielectric layers (for example, as shown as stack 450 in FIG. 5 or stack 460 in FIG. 6). In one or more embodiments, these layer stacks (with or without the conductive layers 310 and/or 320) may also be formed using a single masking step.

Each of the dielectric layers described herein may comprise any dielectric material. In one or more embodiments, the dielectric material may include an oxide, a nitride, an oxynitride and combinations thereof. Examples of possible oxides include, but not limited to silicon oxide, aluminum oxide, hafnium oxide, tantalum oxide, and combinations thereof. Examples of possible nitrides include, but not limited to, silicon nitride. Examples of possible oxynitrides include, but not limited to, silicon oxynitride.

The dielectric material may comprise a high-k material. The high-k material may have a dielectric constant greater than that of silicon dioxide. In one or more embodiments, the high-k material may have a dielectric constant greater that about 3.9. In one or more embodiments, the dielectric may be a gas. In one or more embodiments, the dielectric may be air. In one or more embodiments, the dielectric may be a vacuum.

In one or more embodiments, the various dielectric layers, may be formed of the same different dielectric material. In one or more embodiments, two or more of the dielectric layers may be formed of different dielectric materials.

The conductive lines, the conductive layers, the conductive vias and conductive contacts described herein may comprise one or more conductive materials. Generally, any conductive material may be used. This applies, without limitation to any of the conductive lines Mn(1), Mn+1(1) described herein, the conductive layers C1, C2, . . . , Cm-1 described herein as well as the conductive vias (e.g., Vn(1)), and conductive contacts (e.g., K1, K2) described herein. In one or more embodiments, the conductive lines Mn(1), Mn+1(1) may be formed of the same conductive material as the conductive layers C1, C2, . . . , Cm-1. In one or more embodiments, the conductive lines Mn(1), Mn+1(1) may be formed of a different conductive material as the conductive layers C1, C2, . . . , Cm-1.

In one or more embodiments, the conductive material may comprise a metallic material. The metallic material may comprise a pure metal. The metallic material may comprise a metal alloy. The metallic material may comprise, without limitation, one or more periodic table elements from the group consisting of Al (aluminum), Cu (copper), Au (gold), Ag (silver), W (tungsten), Ti (titanium), and Ta (tantalum).

As possible examples, the conductive material may comprise one or more materials selected from the group consisting of pure aluminum, aluminum alloy, pure copper, copper alloy, pure gold, gold alloy, pure silver, silver alloy, pure tungsten, tungsten alloy, pure titanium, titanium alloy, pure tantalum, and tantalum alloy. It is understood that the pure metals may include small amounts of trace impurities.

As additional examples, the conductive material may comprise a nitride such as a refractory metal nitride. Examples include, but not limited to, TiN, TaN and WN.

In one or more embodiments, each of the conductive layers described above (for example, any of the conductive layers C1 through Cm-1 as well as the conductive layers 310, 320), may comprise one or more conductive materials. In one or more embodiments, a conductive layer may consist essentially of a single conductive material. However, in one or more embodiments, a conductive layer may comprise two or more different conductive materials. For example, referring to the embodiments shown in FIGS. 1 through 4, in one or more embodiments, the conductive layer C1 may be a heterogeneous mixture or composite structure of two or more conductive materials. In one or more embodiments, the conductive layer C1 may itself comprise a stack of two or more layers (e.g. sub-layers) of different conductive materials. The same is true for the conductive layers C1, C2 shown in FIG. 5 as well as the conductive layers C1 through Cm shown in FIG. 6.

As noted, the conductive layers 310, 320 described above, may, of course, comprise any conductive material. In one or more embodiments, conductive layer 310 may be a barrier layer. In one or more embodiments, the conductive layer 320 may be a barrier layer. The conductive layers 310, 320 may comprise a metal nitride, such as a refractory metal nitride. Examples include TiN, TaN and WN. The barrier layer may include essentially pure metals or metal alloys. Examples, include pure titanium, pure tantalum, pure tungsten, titanium alloy, tantalum alloy and tungsten alloy. One or both of the barrier layers may comprise two or more different materials. For example, one or more of the barrier layers may comprise a stack of two or more layers of different materials. For example, in one or more embodiments, one or more of the barrier layers may comprise a pure titanium/TiN stack or titanium alloy/TiN stack (the layers may be deposited in any order). Likewise, in one or more embodiments, one or more of the barrier layers may comprise a pure tantalum/TaN stack or a tantalum alloy/TaN stack (the layers may be deposited in any order). The barrier layer may serve to prevent unwanted reaction between the materials on either side of the barrier layer or possibly to serve as a promoter of the adhesion of the different layers. It is, of course, understood that any pure metal may include small amounts of trace impurities.

In one or more embodiments, the conductive layers 310, 320 may comprise the same materials. In one or more embodiments, the conductive layers 310, 320 may comprise different materials.

It is possible that the conductive materials used for any of the conductive layers, conductive lines, conductive vias or conductive contacts may be non-metallic conductive materials. For example, the conductive material may be a doped polysilicon material (such as n-type doped or p-type doped). The conductive material may also be formed of a conductive polymer.

The various conductive layers, conductive lines, conductive vias and conductive contacts may be formed of the same conductive materials. Two or more of the various conductive layers, conductive lines, conductive vias, and conductive contacts may be formed of the same conductive materials.

Hence, it is noted, that the present invention applies at least to both copper and aluminum metallization systems. Referring, for example, to the embodiments shown in FIGS. 1 through 6, in one or more embodiments, the conductive lines Mn(1), Mn+1(1) may comprise pure copper or a copper alloy.

The copper alloy may be a copper aluminum alloy. In this case, in one embodiment, it is possible that the conductive via Vn(1) may also comprise pure copper or copper alloy. However, in another embodiment, the conductive via Vn(1) may comprise pure tungsten or a tungsten alloy.

In another embodiment, the conductive lines Mn(1), Mn+1 (1) may comprise pure aluminum or an aluminum alloy. The aluminum alloy may be an aluminum copper alloy. In this case, in one or more embodiments, the conductive via Vn(1) may comprise pure tungsten or a tungsten alloy.

In another embodiments, the conductive line Mn+1(1) may comprise pure copper or copper alloy while the conductive line Mn(1) may comprise pure aluminum or aluminum alloy. In this case, in one or more embodiments, the conductive via may comprise pure copper or a copper alloy. In another embodiment, the conductive via may comprise pure tungsten or a tungsten alloy.

The embodiments of the invention shown in FIGS. 1 through 6 include at least a first capacitor in series with a second capacitor. Forming a capacitor arrangement as a series combination of two or more capacitors may be beneficial in that it may improve reliability of the arrangement. A capacitor arrangement having at least two capacitors in series (such as CAP1 and CAP2 as shown in FIGS. 1 through 4) may have a significantly smaller failure probability than a single capacitor. The probability for failure of the device may be the product of the failure of each of the individual capacitive elements (for example, CAP1 and CAP2).

Failure may, for example, be intrinsic or extrinsic. Intrinsic failure may, for example, be cause by dielectric breakdown. If too high a voltage is applied across the capacitor dielectric, the dielectric may breakdown and the capacitor may be destroyed. The value of this breakdown voltage may depend on the thickness of the dielectric, the material of the dielectric and/or the production method used. The time at which such a failure may occur may depend upon operating conditions (for example, voltage applied, operation time, temperature, etc.).

A capacitor may also fail as a result of extrinsic failure. Examples of extrinsic failure may include local thinning of the dielectric, particles on the electrodes or within the dielectric, nonuniformities within the layers as well as structural abnormalities. Extrinsic failures may occur before the intrinsic failures. In many cases, the microscopic physical reasons for extrinsic failure may not be known. Due to its statistical character, only a probability for extrinsic device failure may be calculated.

When a first capacitor and a second capacitor are coupled in series, it is possible that the first capacitor may show a higher leakage than the second. For a series combination of capacitors, the current through each capacitor may be the same and the series connection of capacitors may behave like an asymmetric voltage divider. Due to the higher leakage current of the first capacitor, the voltage across the first capacitor may be smaller than the voltage across the second capacitor and a smaller portion of the external voltage may be across the first capacitor. The second capacitor with the lower current leakage may protect the first capacitor with the higher current leakage.

The capacitor arrangement described herein may be part of a semiconductor structure. For example, capacitor arrangement may be part of a semiconductor chip, an integrated circuit or a semiconductor device.

In one or more embodiments, a semiconductor chip may include an integrated circuit. In one or more embodiments, the capacitor arrangement may be an integrated capacitor arrangement included as part of the integrated circuit.

An embodiment of the invention may be a semiconductor chip including a capacitor arrangement coupled between a first metallization level and a second metallization level of the chip, the second metallization level being adjacent the first metallization level, the capacitor arrangement comprising: a first capacitor including a first electrode surface and a second electrode surface; and a second capacitor stacked above and electrically coupled in series with the first capacitor, the second capacitor including a third electrode surface and a fourth electrode surface, the second and third electrode surfaces being electrically floating.

An embodiment of the invention may be a semiconductor chip, comprising: first capacitor including a first electrode surface, a second electrode surface and a first dielectric between the first electrode surface and the second electrode surface; and a second capacitor stacked above and in electrical series with the first capacitor, the second capacitor including a third electrode surface, a fourth electrode surface and a second dielectric between the third and fourth electrode surfaces, the first and second dielectrics being between two adjacent metallization levels of the chip, the second and third electrode surfaces being electrically floating.

An embodiment of the invention may be a semiconductor chip, comprising: a first conductive line, the first conductive line being part of a first metallization level; a first dielectric layer disposed over the first conductive line; a first conductive layer disposed over the first dielectric layer, the first conductive layer electrically floating; a second dielectric layer disposed over the first conductive layer;

a conductive via disposed over the second dielectric layer; and a second conductive line disposed over the conductive via, the second conductive line being part of a second metallization level, the second metallization level being adjacent to the first metallization level.

An embodiment of the invention may be a semiconductor chip, comprising: a first conductive line, the first conductive line being part of a first metallization level; a stack of layers disposed over the first conductive line, the stack including an alternating arrangement of a plurality of dielectric layers and at least one conductive layer, the layered stack beginning with a first dielectric layer and ending with a last dielectric layer, each of the at least one conductive layer being electrically floating; a conductive via disposed over the layered stack; and a second conductive line disposed over the conductive via, the second conductive line being part of a second metallization level, the second metallization level adjacent to the first metallization level.

An embodiment of the invention may be a method of making a semiconductor structure including a capacitor arrangement, the method comprising: forming a first conductive line, the first conductive line being part of a first metallization level; forming a stack of layers over the first conductive line, the stack of layers including a first dielectric layer, a first conductive layer over the first dielectric layer, and a second dielectric layer over the first conductive layer; etching the stack of layers to formed a etched stack of layers, the etching being performed using a single masking step; forming a conductive via over the etched stack of layers; and forming a conductive line over the conductive via, the conductive line being part of a second metallization level adjacent to the first metallization level.

The disclosure herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor chip including a capacitor arrangement coupled between a first metallization level and a second metallization level of said chip, said second metallization level being adjacent said first metallization level, said capacitor arrangement comprising:
   a first capacitor including a first electrode surface and a second electrode surface; and
   a second capacitor stacked above and electrically coupled in series with said first capacitor, said second capacitor including a third electrode surface and a fourth electrode surface, said second and third electrode surfaces being electrically floating.

2. The chip of claim 1, wherein said first electrode surface is the electrode surface for only said first capacitor and said fourth electrode surface is the electrode surface for only said second capacitor.

3. The chip of claim 1, wherein said fourth electrode surface is electrically coupled to said second metallization level through at least one conductive via.

4. The chip of claim 1, wherein said first, second, third and fourth electrode surfaces are each metallic surfaces.

5. The chip of claim 1, wherein said second electrode surface and said third electrode surface are opposite surfaces of a conductive layer.

6. The chip of claim 1, wherein said second electrode surface overlies said first electrode surface and said fourth electrode surface overlies said third electrode surface.

7. The chip of claim 1, wherein said first capacitor includes a first dielectric layer between said first electrode surface and said second electrode surface, and wherein said second capacitor includes a second dielectric layer between said third electrode surface and said fourth electrode surface.

8. A semiconductor chip, comprising:
   a first capacitor including a first electrode surface, a second electrode surface and a first dielectric between said first electrode surface and said second electrode surface; and
   a second capacitor stacked above and in electrical series with said first capacitor, said second capacitor including a third electrode surface, a fourth electrode surface and a second dielectric between said third and fourth electrode surfaces, said first and second dielectrics being between two adjacent metallization levels of said chip, said second and third electrode surfaces being electrically floating.

9. The chip of claim 8, wherein said second and third electrode surfaces are opposite surfaces of a conductive layer.

10. The chip of claim 8, wherein said first electrode surface is the electrode surface for only said first capacitor and said fourth electrode surface is the electrode surface for only said second capacitor.

11. The chip of claim 8, wherein said first electrode surface, said second electrode surface, and third electrode surface and said fourth electrode surface each comprise a metallic material.

12. The chip of claim 8, wherein said metallization levels include a second metallization level above a first metallization level, said chip further comprising a conductive via between said second metallization level and said second dielectric.

13. The chip of claim 8, wherein said second electrode surface overlies said first electrode surface and said fourth electrode surface overlies said third electrode surface.

* * * * *